(12) United States Patent
Sakai

(10) Patent No.: US 7,071,486 B2
(45) Date of Patent: Jul. 4, 2006

(54) EMITTER, MANUFACTURING METHOD AND MANUFACTURING APPARATUS THEREOF, ELECTRO-OPTICAL APPARATUS AND ELECTRONIC APPARATUS

(75) Inventor: Hirofumi Sakai, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/760,178

(22) Filed: Jan. 19, 2004

(65) Prior Publication Data

US 2004/0232814 A1    Nov. 25, 2004

(30) Foreign Application Priority Data

Jan. 28, 2003   (JP)   ............................. 2003-018776
Jan. 9, 2004    (JP)   ............................. 2004-003754

(51) Int. Cl.
*H01L 35/24* (2006.01)
(52) U.S. Cl. .......................................... 257/40; 257/79
(58) Field of Classification Search ................ 257/40, 257/79–84
See application file for complete search history.

(56) References Cited

U.S. PATENT DOCUMENTS 6,366,025 B1 *  4/2002  Yamada ................... 315/169.3
6,724,150 B1 *  4/2004  Maruyama et al. ...... 315/169.3
6,750,472 B1 *  6/2004  Suzuki et al. ................. 257/40

FOREIGN PATENT DOCUMENTS

| JP | 10-012377   | 1/1998 |
| JP | 10-153967   | 6/1998 |
| JP | 2000-208254 | 7/2000 |

\* cited by examiner

*Primary Examiner*—Wai-Sing Louie
(74) *Attorney, Agent, or Firm*—Harness, Dickey & Pierce, P.L.C.

(57) ABSTRACT

An emitter has a plurality of types of light-emitting units with different changes in emission characteristics over time. In addition, the emitter includes a deterioration adjustment device which adjusts the deterioration of the emission characteristics over time in a predetermined type of light-emitting unit. The light-emitting units respectively include a light-emitting layer and a hole donor which supplies positive holes to the light-emitting layer, and the deterioration adjustment device may be the hole donor in which the thickness is adjusted based on the deterioration in emission characteristics over time in the predetermined type of light-emitting unit.

18 Claims, 9 Drawing Sheets

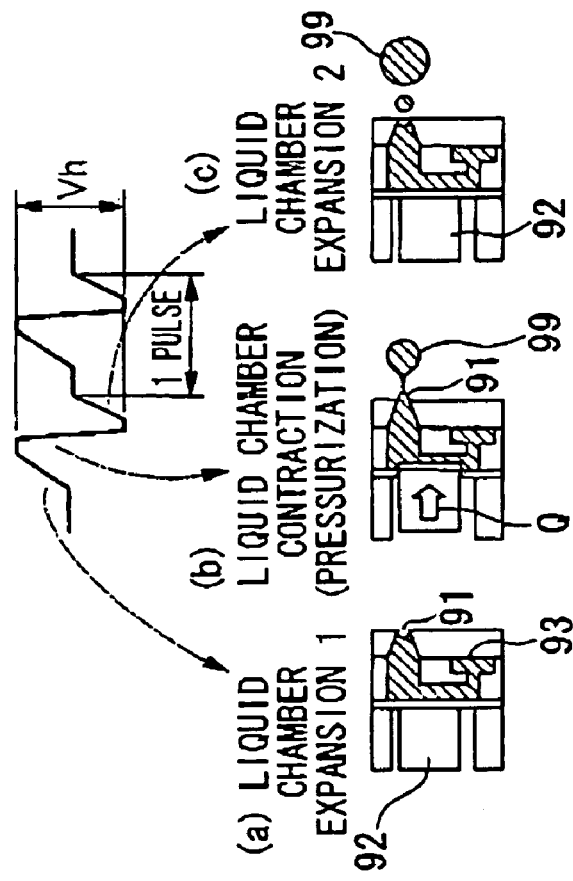
FIG. 2C
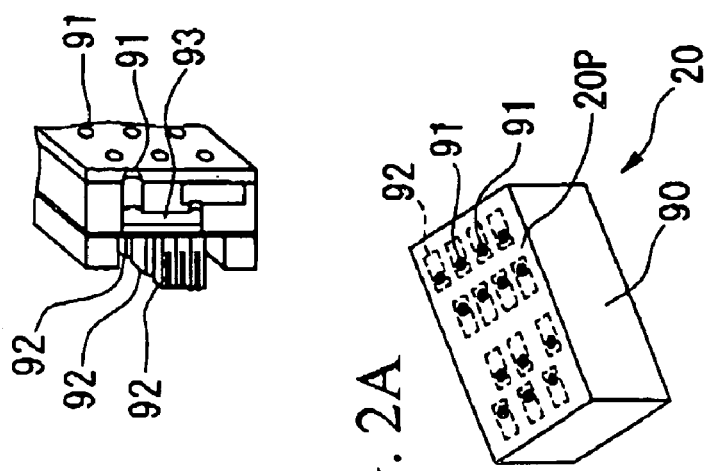
FIG. 2B
FIG. 2A

EMITTER, MANUFACTURING METHOD AND MANUFACTURING APPARATUS THEREOF, ELECTRO-OPTICAL APPARATUS AND ELECTRONIC APPARATUS

BACKGROUND OF THE INVENTION

1. Field of the Invention

The present invention relates to an emitter, a manufacturing method and a manufacturing apparatus thereof, an electro-optical apparatus and an electronic apparatus.

2. Description of Related Art

Various emitters such as displays and light sources using self-emitting devices in the form EL devices (and particularly organic EL devices) have been proposed in the past, and among these emitters, an organic EL display apparatus is also known that is capable of displaying colors. During the production of an organic EL device, for example, a material that forms a light-emitting layer and a material that forms a positive hole injection (PEDOT)/electron transport layer are used as ink, and each material is patterned on a device substrate such as a TFT by red, green and blue ink using an inkjet method to produce a self-emitting full-color EL device, and this technology is disclosed in Japanese Unexamined Patent Application, First Publication No. H10-12377 and Japanese Unexamined Patent Application, First Publication No. H10-153967.

In order to perform color display with this type of organic EL display device, a single pixel is normally composed with an organic EL device Light-emitting unit) that emits red light, an organic EL device (light-emitting unit) that emits green light, and an organic EL device (light-emitting unit) that emits blue light corresponding to the three primary colors of light in the form of red (R), green (G) and blue (B). For example, in the case of making an arbitrary pixel bright white, each of the red, green and blue organic EL devices that compose the pixel should all be made to emit light. In addition, by suitably controlling the emission brightness of each red, green and blue organic EL device that compose a pixel, an arbitrary pixel can be made to emit light of a desired color and brightness. In the case of performing color display using the three colors of organic EL devices as mentioned above, it is known to be important to ensure satisfactory white balance.

However, conventionally, there are problems like those described below.

Although a product is able to maintain satisfactory white balance immediately after being shipped, due to differences in the deterioration characteristics of the red, green and blue light-emitting materials over time, the white balance breaks down due to changes in each color over time. Thus, even when a predetermined current is supplied to each organic EL device with the intention of emitting white light, the actual color is not an attractive white color, and even if another arbitrary color is attempted to be emitted at an arbitrary brightness, there was the problem of again not being able to obtain the intended emitted color.

In consideration of the aforementioned problems, the object of the present invention is to provide an emitter allowing the obtaining of a satisfactory emission state even if there are changes over time in an emitter (e.g., EL apparatus) composed by containing a plurality of types of light-emitting units (e.g., EL devices) having different changes in emission characteristics over time, a manufacturing method and manufacturing system of this emitter, an electro-optical apparatus and electronic apparatus.

SUMMARY OF THE INVENTION

The present invention employs the following constitution to achieve the aforementioned object.

The first aspect of the present invention is an emitter having a plurality of types of light-emitting units with different changes in emission characteristics over time, comprising a deterioration adjustment device which adjusts the deterioration of the emission characteristics over time in a predetermined type of light-emitting unit.

According to this aspect, by adjusting the deterioration of emission characteristics over time in a predetermined type of light-emitting unit to match the deterioration over time in another light-emitting unit, the state of deterioration between the plurality of types of light-emitting units can be made to be the same even if changes in emission characteristics occur over time, thereby making it possible to maintain a constant color balance by the plurality of types of light-emitting units.

In the case of the light-emitting units respectively having a light-emitting layer and a hole donor which supplies positive holes to the light-emitting layer, a constitution can be employed that uses for the deterioration adjustment device a hole donor in which the thickness is adjusted based on the deterioration in emission characteristics over time in the aforementioned predetermined type of light-emitting unit. In addition, in the case the light-emitting units respectively have a light-emitting layer and an electron donor which supplies electrons to the light-emitting layer, a constitution can be employed that uses for the deterioration adjustment device an electron donor in which the thickness is adjusted based on the deterioration of emission characteristics over time in the aforementioned predetermined type of light-emitting unit. Moreover, in the case the light-emitting units respectively have a light-emitting layer and a hole donor which supplies positive holes to the light-emitting layer, a constitution can be employed that uses for the deterioration adjustment device at least one of either the aforementioned light-emitting layer and the aforementioned hole donor into which impurities are mixed based on the deterioration of emission characteristics over time in the aforementioned predetermined type of light-emitting unit.

A constitution can be employed for the deterioration adjustment device which adjusts the deterioration of emission characteristics over time in the predetermined type of light-emitting unit according to the light-emitting unit among the aforementioned plurality of types of light-emitting units that has the largest degree of deterioration of emission characteristics over time.

As a result, since a light-emitting unit having a large degree of deterioration of emission characteristics over time can be made to match a light-emitting unit having a small degree of deterioration of emission characteristics over time by adjusting the deterioration over time, the state of deterioration between the plurality of types of light-emitting units can be made to be the same even if changes in emission characteristics occur over time, thereby making it possible to maintain a constant color balance by the plurality of types of light-emitting units.

The second aspect of the present invention is an electro-optical apparatus having the aforementioned emitter as display apparatus.

According to this aspect, the present invention allows the obtaining of an electro-optical apparatus capable of displaying a satisfactory emission state even if changes occur over time.

The third aspect of the present invention is an electronic apparatus having the aforementioned emitter as display apparatus.

According to this aspect, the present invention allows the obtaining of electronic apparatus capable of displaying a satisfactory emission state even if changes occur over time.

The fourth aspect of the present invention is a manufacturing method of an emitter having a plurality of types of light-emitting units with different changes in emission characteristics over time, the method having a deterioration adjustment step of adjusting deterioration of the emission characteristics over time in a predetermined type of light-emitting unit.

The fifth aspect of the present invention is a manufacturing apparatus of an emitter having a plurality of types of light-emitting units with different changes in emission characteristics over time, the apparatus comprising a deterioration adjustment device which adjusts deterioration of the emission characteristics over time in a predetermined type of light-emitting unit.

According to this aspect, by matching the deterioration of emission characteristics over time in a predetermined type of light-emitting unit to the deterioration over time in another light-emitting unit by adjusting the deterioration over time, the deterioration state between the plurality of types of light-emitting units can be made to be the same even if changes occur in emission characteristics over time, thereby making it possible to maintain a constant color balance by the plurality of types of light-emitting units.

In the case the light-emitting units respectively have a light-emitting layer and a hole donor which supplies positive holes to the light-emitting layer, the thickness of the hole donor is preferably adjusted in the deterioration adjustment step or deterioration adjustment device based on the deterioration of emission characteristics over time in the predetermined type of light-emitting unit.

In this case, by thinly forming the hole donor in the light-emitting unit in which the degree of deterioration over time is small as compared with that of another light-emitting unit, for example, the degree of deterioration over time can be increased, thereby making it possible to make the deterioration state between the plurality of types of light-emitting units the same.

In addition, in the case of having a discharge step or discharge device which forms a hole donor by discharging a liquid containing a hole donor material a constitution is employed in the deterioration adjustment step or deterioration adjustment device which adjusts the weight or the number of drops of the liquid discharged.

In this case, by adjusting the weight or number of drops of the liquid discharged, for example, a hole donor can be thinly formed in a predetermined type of light-emitting unit having a small degree of deterioration over time.

BRIEF DESCRIPTION OF THE DRAWINGS

FIGS. 2A to 2C are drawings showing the structure of an inkjet head.

DETAILED DESCRIPTION OF THE INVENTION

Figure 1:
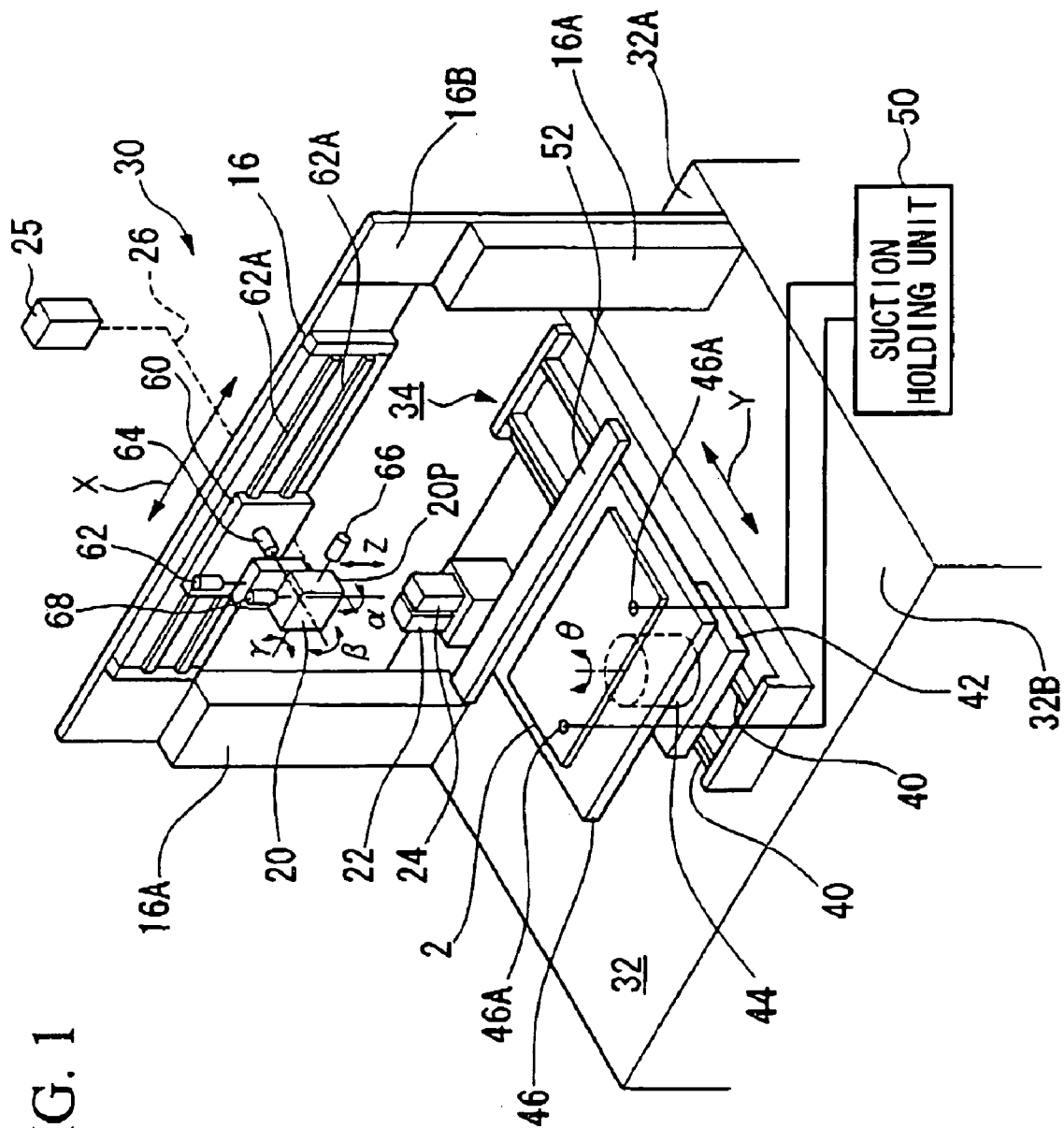
FIG. 1 is a perspective view of the general appearance of a manufacturing apparatus according to the present invention.

The following provides an explanation of embodiments of an emitter of the present invention, a manufacturing method and manufacturing apparatus thereof, an electro-optical apparatus and electronic apparatus with reference to FIGS. 1 to 11.

The present embodiment applies the present invention to a display apparatus (organic EL display apparatus) in the form of an organic EL apparatus (emitter) capable of color display by having a single pixel with three dots of an organic EL device capable of emitting red color (light-emitting unit), organic EL device capable of emitting green light (light-emitting unit) and organic EL device capable of emitting blue color (light-emitting unit). Furthermore, the scale in each of the reference drawings may differ for each layer and member in order to make them of a legible size in the drawings.

FIRST EMBODIMENT

First, an explanation is provided of a manufacturing apparatus for producing an EL apparatus.

FIG. 1 is a perspective view of the general appearance of a film deposition apparatus (inkjet apparatus) that composes an EL manufacturing apparatus (device manufacturing apparatus). Film deposition apparatus 30 employs a constitution in which an ink to be described later containing light-emitting materials and a positive hole transport material is discharged onto a substrate by an inkjet system.

Film deposition apparatus 30 has, among other components, a base 32, a first movement unit 34, a second movement unit 16, an electronic balance not shown (weighing unit), a liquid droplet discharge head in the form of inkjet head (discharge apparatus) 20, a capping unit 22 and a cleaning unit 24. The first movement unit 34, electronic balance, capping unit 22, cleaning unit 24 and second movement unit 16 are respectively arranged on base 32.

First movement unit 34 is preferably installed directly on base 32, and this first movement unit 34 is positioned along the direction of the Y axis. In contrast, the second movement unit 16 is attached perpendicular to base 32 using support columns 16A, and second movement unit 16 is also attached to rear section 32A of base 32, The direction of the X axis of second movement unit 16 is perpendicular to the direction of the Y axis of first movement unit 34. The Y axis is the axis along the direction of font section 32A and rear section 32B of base 32. In contrast, the X axis is the axis along the left and right directions of base 32, and is respectively horizontal.

First movement unit 34 has guide rails 40, and first movement unit 34 can employ, for example, a linear motor. Slider 42 of this linear motor type of first movement unit 34 can be positioned by moving in the direction of axis Y along guide rails 40, Table 46 positions a workpiece in the form of substrate 2 while also being able to maintain that position. In addition, table 46 has a suction holding unit 50 that is capable of holding substrate 2 by sectioning onto table 46 through hole 46A in table 46 due to the operation of suction holding unit 50. A preliminary discharge area 52 is provided on table 46 for discarded discharge or test discharge (preliminary discharge) of ink by inkjet head 20.

The second movement unit 16 has a column 16B fastened to support columns 16A, and this column 16B has a linear motor type of second movement unit 16. Slider 60 can be positioned by moving in the direction of axis X along guide rails 62A. Slider 60 is provided with an ink discharge unit in the form of inkjet head 20.

Slider 42 is provided with a θ axis motor 44. This motor is, for example, a direct drive motor, and the rotor of motor 44 is fastened to table 46. As a result, by supplying power to motor 44, rotor and table 46 rotate along the θ direction making it possible to index (rotate) table 46.

Inkjet head 20 has oscillating positioning units in the form of motors 62, 64, 66 and 68. When motor 62 is operated, inkjet head 20 can be positioned vertically along the Z axis. This Z axis is in a direction (vertical direction) that is perpendicular to the X axis and Y axis, respectively. When motor 64 is operated, inkjet head 20 can be positioned by oscillating along the β direction about the Y axis. When motor 66 is operated, inkjet head 20 can be positioned by oscillating in the 7 direction about the X axis. When motor 68 is operated, inkjet head 20 can be positioned by oscillating in the a direction about the Z axis.

In this manner, since inkjet head 20 in FIG. 1 can be positioned by moving directly in the direction of the Z axis on slider 60, and can be positioned by oscillating along the α, β and γ directions, the location or orientation of an ink discharge surface 20P of inkjet head 20 can be accurately controlled relative to substrate 2 on table 46. Furthermore, a plurality (e.g., 120) of openings in the form of nozzles that respectively discharge ink are provided in ink discharge surface 20P of inkjet head 20.

Here, an explanation is provided of an example of the structure of inkjet head 20 with reference to FIGS. 2A to 2C.

Inkjet head 20 is a head that uses, for example, piezoelectric-devices, and as shown in FIG. 2A, a plurality of nozzles 91 are formed in ink discharge surface 20P of head body 90. Piezoelectic devices 92 are provided for each of these nozzles 91.

As shown in FIG. 2B, piezoelectric devices 92 are arranged corresponding to nozzles 91 and ink chamber 93, are positioned between, for example, a pair of electrodes (not shown), and are composed so as to bend so as to protrude to the outside when power is supplied. As a result of applying an applied voltage Vh to a piezoelectric device 92 as shown in FIG. 2C, piezoelectric device 92 expands and contracts in the direction of arrow Q thereby causing a liquid droplet (ink droplet) of a predetermined volume to be discharged from nozzle 91. The driving of these piezoelectric devices 92, namely the discharge of liquid droplets from inkjet head 20, is controlled by a deterioration adjustment device in the form of control device 25 (see FIG. 1).

Returning to FIG. 1, the electronic balance receives, for example, 5000 droplets from the nozzles of inkjet head 20 in order to manage the weight of a single droplet of ink discharged from the nozzles of inkjet 20 by measuring its weight. The electronic balance is able to measure the weight of a single ink droplet quite accurately by dividing the weight of these 5000 ink droplets by 5000. The amount of ink droplets discharged from inkjet head 20 can then be optically controlled based on the measured weight of the ink droplets.

Continuing, an explanation is provided of a film deposition treatment step.

When a worker places a substrate 2 onto table 46 of first movement unit 34 from the front end of table 46, this substrate 2 is positioned by being sectioned and held on table 46. Motor 44 operates to position the edge of substrate 2 so as to be parallel with the direction of the Y axis.

Next, inkjet head 20 moves along the direction of the X axis and is positioned above the electronic balance. A specified number of droplets (specified number of ink droplets) are then discharged. As a result, the electronic balance measures the weight of, for example, 5000 droplets of ink, and calculates the weight per single ink droplet. A judgment is then made as to whether the weight per ink droplet is within a preset proper range, and if it is outside this range, the voltage applied to piezoelectric devices 92 is adjusted so as to obtain a weight per ink droplet that falls within the proper range.

In the case the weight per ink droplet is appropriate, together with substrate 2 being positioned by suitably moving in the direction of the Y axis by first movement unit 34, inkjet et head 20 is positioned by suitably moving in the direction of the X axis by second movement unit 16. After preliminarily discharging ink from all nozzles onto a preliminary discharge area 52, inkjet head 20 moves relatively in the direction of the Y axis with respect to substrate 2 (in actuality, substrate 2 moves in the Y direction relative to inkjet head 20), and discharges ink at a predetermined width from predetermined nozzles onto a predetermined area on substrate 2 under the control of control system 25. Once a single round of relative movement by inkjet head 20 and substrate 2 is completed, inkjet head 20 moves by being indexed by a predetermined amount in the direction of the X axis relative to substrate 2, after which it discharges ink during the time substrate 2 moves relative to inkjet head 20. By then repeating this operation a plurality of times, ink is discharged over the entire film deposition area on substrate 2 thereby making it possible to deposit a film.

Continuing, an explanation is provided of an organic EL apparatus according to the present invention with reference to FIGS. 3 to 6.

Figure 3:
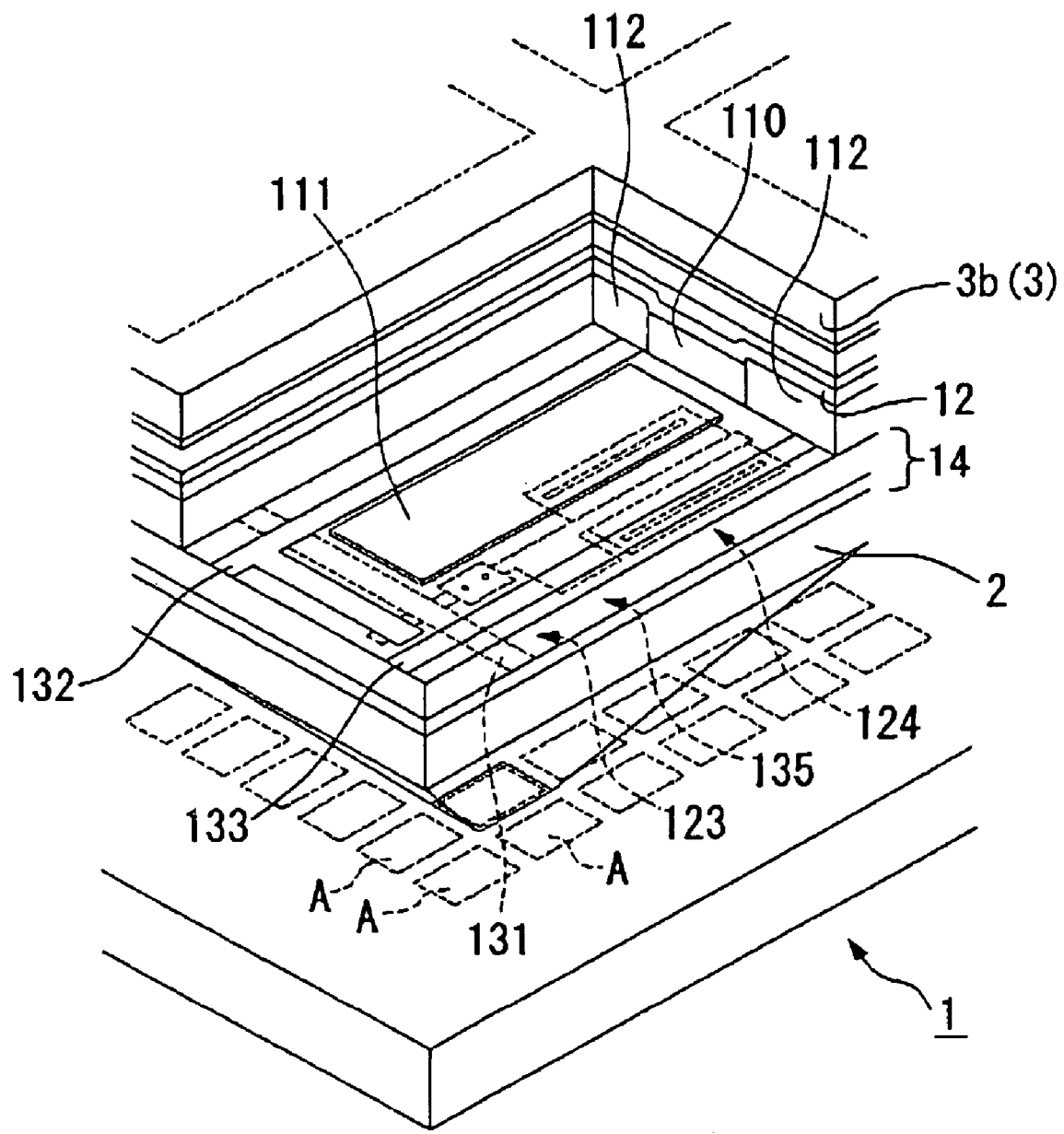
FIG. 3 is a drawing schematically showing the constitution of an organic EL apparatus of the present invention.

FIG. 3 shows an organic EL apparatus, and more particularly, schematically shows an embodiment in which the present invention is applied to an active matrix type of organic EL apparatus. In addition, this organic EL apparatus (emitter) 1 employs an active type of drive system using a thin film transistor.

Organic EL apparatus 1 is composed by sequentially laminating a circuit device in the form of a circuit device section 14 that contains a thin film transistor, a pixel electrode (anode) 11, a functional layer containing an organic EL layer (organic EL device), an electron donor in the form of a cathode 12, and a sealing section 3 and so forth on a substrate 2.

A glass substrate is used for substrate 2 in the present embodiment. In addition to a glass substrate, examples of other substrates that can be used in the present invention include a silicon substrate, quartz substrate, ceramic substrate, metal substrate, plastic substrate, plastic film substrate and various other known substrates used in electro-optical apparatuses and circuit boards.

A plurality of pixel areas (light-emitting units) A are arranged in the form of a matrix on substrate 2 as light-emitting areas, and in the case of color display, for example, pixel areas A corresponding to each of the colors of red (R), green (G) and blue (B) are arranged in a predetermined configuration. A pixel electrode 111 is arranged for each pixel area A, and a signal line 132, power line 133, scanning line 131 and scanning lines for other pixel electrodes not shown are arranged in the vicinity thereof. In addition to the rectangular shape shown in the drawings, a circular shape, oval shape or other arbitrary shape is applied for the two-dimensional shape of pixel area A.

In addition, sealing section 3 prevents oxidation of cathode 12 or functional layer 10 by preventing the entrance of water and oxygen, and contains a sealing resin coated onto substrate 2 and a sealing substrate 3b (package). Examples of materials of the sealing resin include thermosetting resins or ultraviolet-cured resins, and epoxy resin, which is a type of thermosetting resin, is used preferably. The sealing resin is coated in the form of a ring around the periphery of substrate 2, and is applied with, for example, a microdispenser. Sealing substrate 3b is composed of glass or metal, and substrate 2 and sealing substrate 3b are laminated by means of sealing resin.

Figure 4:
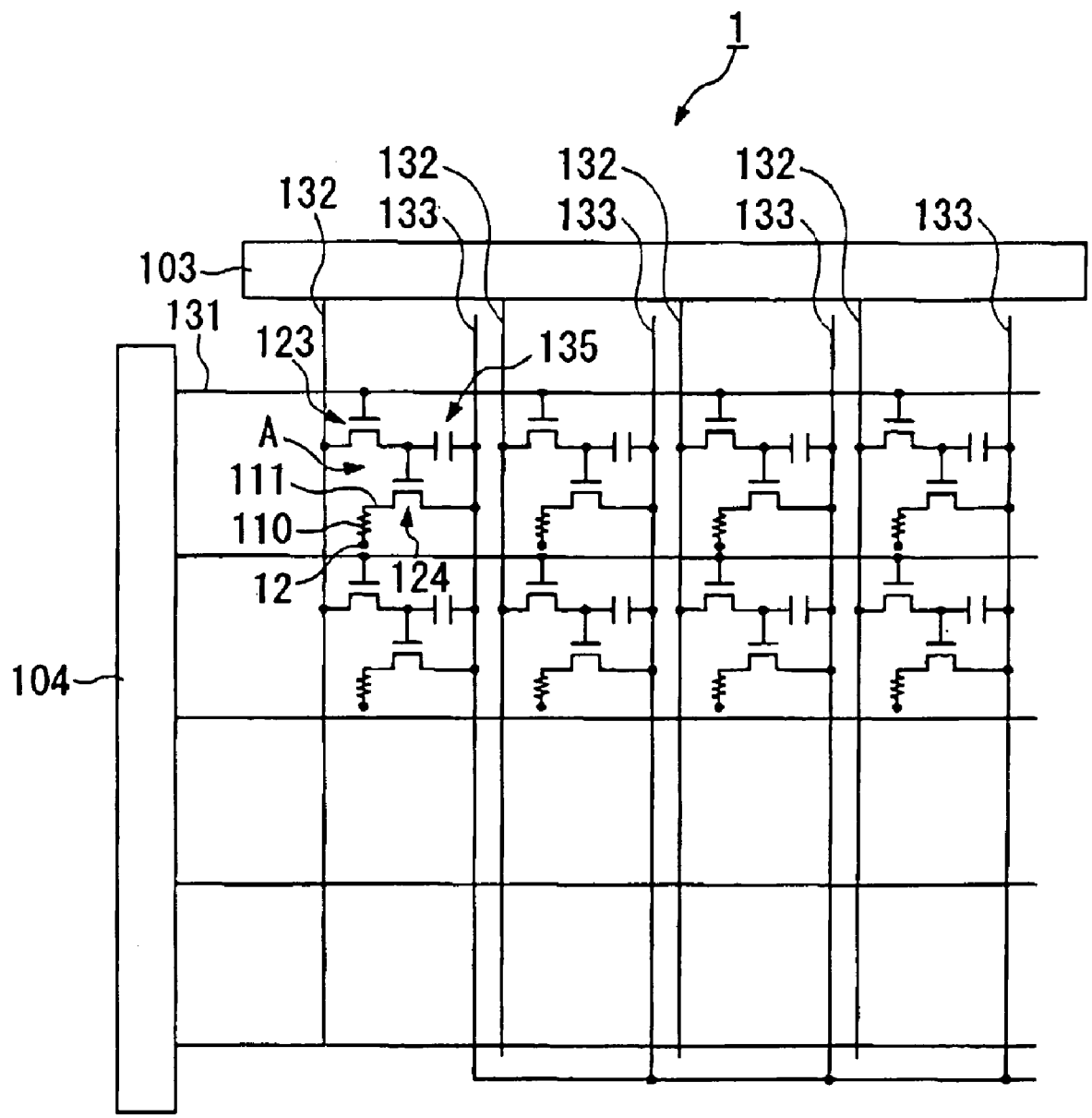
FIG. 4 is a circuit drawing of an active matrix type of organic EL apparatus.

FIG. 4 shows the circuit structure of the aforementioned organic EL apparatus 1.

In FIG. 4, a plurality of scanning lines 131, a plurality of signal lines 132 extending in a direction that intersects with scanning lines 131, and a plurality of power lines 133 extending parallel to signal lines 132 are wired on substrate 2. In addition, an aforementioned pixel area A is formed at each intersection of scanning lines 131 and signal lines 132.

A data drive circuit 103 containing, for example, a shift register, level shifter, video line and analog switch, is connected to signal lines 132. In addition, a scanning drive circuit 104 containing a shift register and level shifter is connected to scanning lines 131.

A first thin film transistor 123 for switching, in which a scanning signal is supplied to a gate electrode via scanning line 131, a holding capacitor 135 that holds the image signal supplied from signal line 132 via this thin film transistor 123, a second thin film transistor 124 for driving, in which the image signal held by holding capacitor 135 is supplied to a gate electrode, a pixel electrode (anode) 111, to which drive current from power line 133 flows when electrically connected to power line 133 via this thin film transistor 124, and a functional layer 110, which is juxtaposed between pixel electrode 111 and a counter electrode (cathode) 12, are provided in a pixel area A. Functional layer 110 contains an organic EL device in the form of an organic EL layer.

In a pixel area A, when a scanning line 131 is driven and the first thin film transistor 123 is switched on, the potential of a signal line 132 at that time is held by holding capacitor 135, and whether or not current is supplied to the second thin film transistor 124 is determined according to the state of this holding capacitor 135. In addition, current flows to pixel electrode 111 from power line 133 via a channel of the second thin film transistor 124, and current then flows to counter electrode (cathode) 12 through functional layer 110. Functional layer 110 then emits light corresponding to the amount of current at this time.

Figure 5:
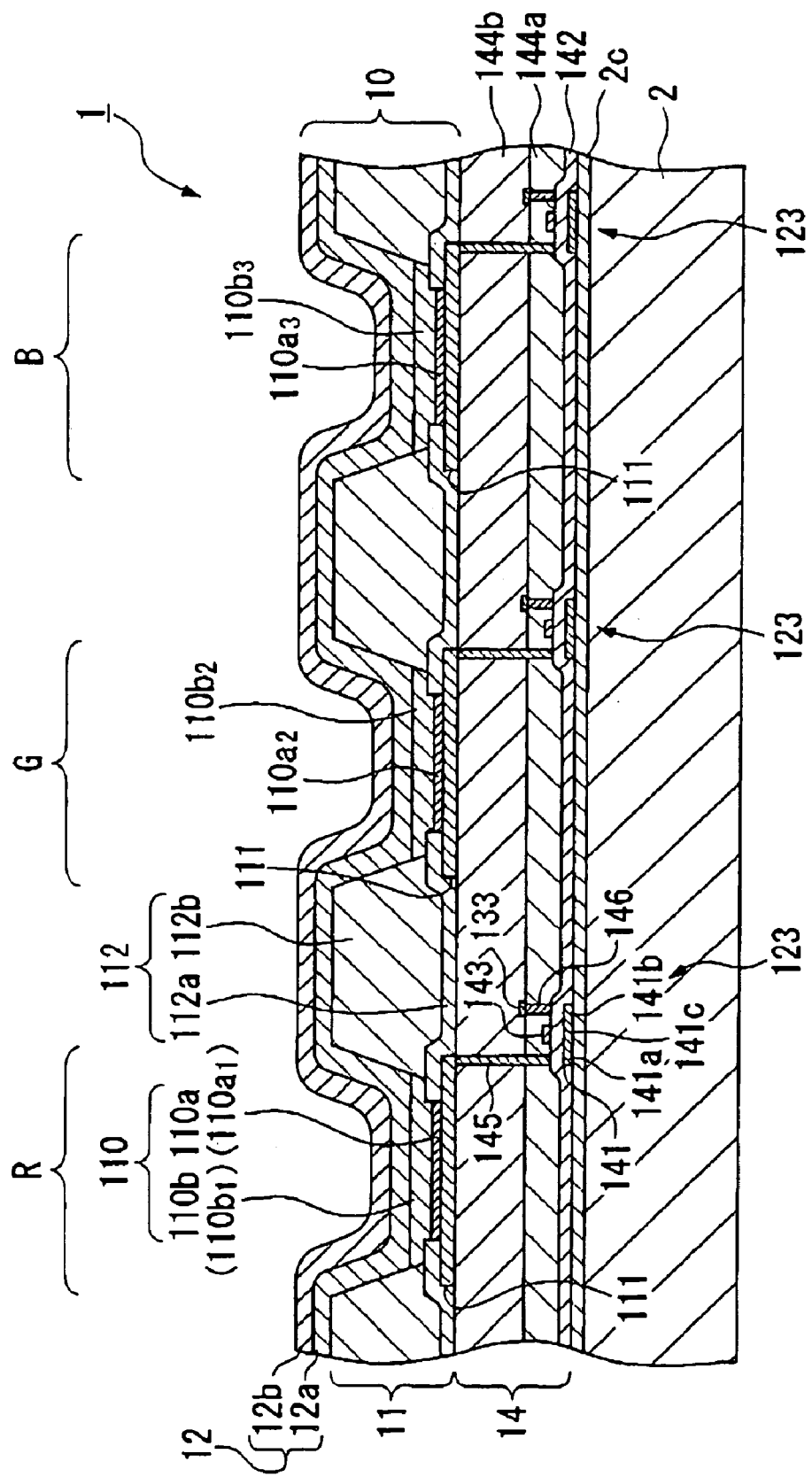
FIG. 5 is an enlarged view showing the cross-sectional structure of the display area of an organic EL apparatus.

FIG. 5 is an enlarged view of the cross-sectional structure of the display area in the aforementioned organic EL apparatus 1. In this FIG. 5, the cross-sectional structure is shown of three pixel areas corresponding to each of the colors of red (R), green (G) and blue (B). As was previously described, organic EL apparatus 1 is composed by sequentially laminating a circuit device section 14 in which is formed a TFT or other circuit, a pixel electrode (anode) 111, a light-emitting device 11 in which is formed functional layer 110, and a cathode 12 on a substrate 2. In this organic EL apparatus 1, together with light emitted on the side of substrate 2 from functional layer 110 being radiated to the lower side (observer side) of substrate 2 by passing through circuit device section 14 and substrate 2, light emitted on the opposite side of substrate 2 from functional layer 110 is reflected by cathode 12 so as to be radiated to the lower side (observer side) of substrate 2 by passing through circuit device section 14 and substrate 2.

An undercoating protective film 2c composed of a silicon oxide film is formed on substrate 2 in circuit device section 14, and an island-shaped semiconductor film 141 composed of polycrystalline silicon is formed on this undercoating protective film 2c. Furthermore, a source region 141a and drain region 141b are formed by high-concentration P ion injection in semiconductor film 141. Furthermore, the section where P is not injected serves as channel region 141c. Moreover, a transparent gate insulting film 142 that covers undercoating protective film 2c and semiconductor film 141 is formed in circuit device section 14, a gate electrode 143 (scanning line) composed of Al, Mo, Ta, Ti or W and so forth is formed on gate insulating film 142, and transparent first interlayer insulating film 144a and second interlayer insulating film 144b are formed on gate electrode 143 and gate insulating film 142. Gate electrode 143 is provided at the location corresponding to channel region 141c of semiconductor film 141. In addition, contact holes 145 and 146 are formed respectively connected to source and drain regions 141a and 141b of semiconductor film 141 through first and second interlayer insulating films 144a and 144b.

A transparent pixel electrode 111 composed of ITO and so forth is formed by patterning to a predetermined shape on second interlayer insulating film 144b, and one of the contact holes 145 is connected to this pixel electrode 111. In addition, the other contact hole 146 is connected to power line 133.

In this manner, a thin film transistor 123 connected to each pixel electrode 111 is formed in circuit device section 14. Furthermore, although the aforementioned holding capacitor 135 and thin film transistor 124 for switching are also formed in circuit device section 14, these are not shown in FIG. 5.

Light-emitting device 11 is mainly composed of functional layers 110 respectively laminated on a plurality of pixel electrodes 111, and bank sections 112 arranged between functional layers 110 that demarcate each functional layer 110. A cathode 12 is arranged on each functional layer 110. An organic EL device serving as a light-emitting device is composed by containing a pixel electrode 111, cathode 12, functional layer 110 and so forth.

Here, a pixel electrode 111 is formed from ITO by patterning into a roughly rectangular shape when viewed from overhead. The thickness of this pixel electrode 111 is preferably within the range of 50–200 nm, and particularly preferably about 150 nm.

As shown in FIG. 5, a bank section 112 is composed by laminating an inorganic bank layer 112a (first bank layer) located on the side of substrate 2, and an organic bank layer 112b (second bank layer) located away from substrate 2. Inorganic bank layer 112a is composed of an inorganic material such as SiO$_2$ or TiO$_2$. In addition organic bank layer 112b is formed from a heat-resistant and solvent-resistant resist such as acrylic resin or polyirmide resin.

A functional layer 110 is composed of a hole donor in the form of a positive hole transport layer (positive hole injection/transport layer) 110a laminated on pixel electrode 111, and an organic EL layer (light-emitting layer) 110b formed on positive hole transport layer 110a in contact therewith.

Together with having the function of injecting (supplying) positive holes to organic EL layer 110b, positive hole transport layer 110a has the function of transporting positive holes within positive hole transport layer 110a. By providing such a positive hole transport layer 110a between pixel electrode 111 and organic EL layer 110b, emission efficiency, service life and other device characteristics of organic EL layer 110b are improved. In addition, in organic EL layer 110b, positive holes injected from positive hole transport layer 110a and electrons injected (supplied) from cathode 12 are re-coupled in the organic EL layer resulting in the emission of light. Furthermore, a mixture of, for example, a polythiophene derivative such as polyethylene dioxythiophene and polystyrene sulfonic acid and so forth can be used for the positive hole transport layer forming material.

Organic EL layer 110b is composed of three types of layers having mutually different emission wavelength bands consisting of a red organic EL layer 110b1 that emits red (R) light, a green organic EL layer 110b2 that emits green (G) light, and a blue organic EL layer 110b3 that emits blue (B) light, and each organic EL layer 110b1 through 110b3 is arranged at a predetermined configuration (e.g., stripes). Furthermore, although the details will be described later, in the present embodiment, positive hole transport layers 110a1 and 110a2 adjacent to red organic EL layer 110b1 and green organic EL layer 110b2 are formed to have a film thickness thinner than positive hole transport layer 110a3 adjacent to blue organic EL layer 110b3.

Furthermore, an electron injection layer may be formed on organic EL layer 110a (on the side of cathode 12), and this may be included in functional layer 110 as necessary. An electron injection layer has the role of promoting injection of electrons into organic EL layer 110 from cathode 12, is formed by a lithium-quinolinol complex having lithium for the central metal, and has a thickness preferably within the range of, for example, 2–5 nm, and particularly preferably about 2 nm. A material other than a lithium-quinolinol complex may be used for the material used for the electron injection layer, preferable examples of which include complexes having metal elements selected from group 1A of the periodic table, group 2A of the periodic table or rare earth elements such as Li, Na, K, Rb, Cs, Mg, Ca, Sr, Ba, La, Ce, Pr, Nd, Pm, Sm, Eu, Gd, Tb, Dy, Ho, Er, Tr, Yb and Lu. An example of complex is sodium quinolinol complex. In addition, the electron injection layer can be formed by preparing a composite ink in which the aforementioned lithium-quinolinol complex is dissolved in a liquid material to be described later, and then discharged onto organic EL layer 110b3 by a liquid discharge method (inkjet method).

Cathode (counter electrode) 12 is formed over the entire surface of light-emitting device 11, and forms a pair with pixel electrode 111 to fulfill the role of allowing current to flow to functional layer 10. This cathode 12 is capable of reducing lithium (Li) ions, and in the present embodiment, is composed by laminating calcium layer 12a and aluminum layer 12b. At this time, a cathode having a low work coefficient is preferably provided for the cathode on the side close to the light-emitting layer, and in this mode in particular, fulfills the role of injecting electrons into light-emitting layer 110b by being in direct contact with light-emitting layer 110b. The thickness of calcium layer 12a is, for example, preferably within the range of 2–50 nm. In addition, aluminum layer 12b reflects light emitted from organic EL layer 110b to the side of substrate 2, and is preferably composed of an Ag film or laminated Al and Ag film and so forth in addition to an Al film. In addition, the thickness of the aluminum layer 12b is, for example, preferably within the range of 100–1000 nm. Moreover, a protective layer for preventing oxidation composed of SiO, SiO$_2$ or SiN and so forth may be provided on the aluminum layer.

Furthermore, although calcium (Ca) is used for the substance able to reduce lithium ions in the present embodiment, this substance is not limited to calcium, but rather Mg or Al may also be used.

In the aforementioned constitution, a pixel electrode (anode) 111, positive hole transport layer 110a, organic EL layer 110b and cathode 12 are laminated in that order from the side of substrate 2 in each pixel area. In an organic EL apparatus 1 composed in this manner, calcium layer 12a of cathode 12 fulfills the role of injecting electrons into organic EL layer 110b by being in direct contact with organic EL layer 110b in each color of organic EL layer 110b.

In addition, an organic EL apparatus 1 of the present embodiment allows the obtaining of an equal degree of emission characteristics and emission service life when compared with the case of an organic EL apparatus provided with an electron injection layer formed using vapor deposition.

Next, an explanation is provided of a method for producing the aforementioned organic EL apparatus 1 with reference to FIGS. 6A to 6D. Furthermore, the circuit device section 14 containing a thin film transistor, the bank sections 112 (organic bank layers 112a and inorganic bank layers 112b) and the pixel electrodes 111 respectively shown in the previous FIG. 5 are assumed to have already been formed on substrate 2.

The manufacturing method of the present embodiment has a positive hole transport layer formation step, an organic EL layer formation step, a cathode formation step and a sealing step and so forth.

Furthermore, the manufacturing method explained here is merely one example of a manufacturing method, and other steps may be omitted or added as necessary.

(Positive Hole Transport Layer Formation Step)

Figure 6A:
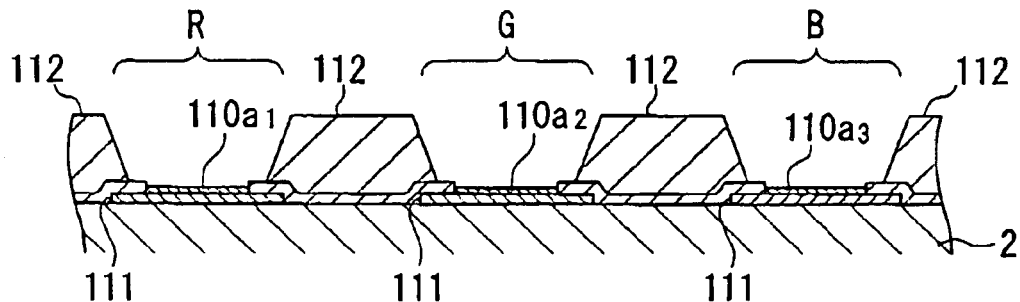
FIGS. 6A to 6D are explanatory drawings for explaining the manufacturing method of an organic EL apparatus.

As shown in FIG. 6A, a positive hole transport layer 110a is formed on substrate 2 on which pixel electrodes are formed.

In the positive hole transport layer formation step, a composition (liquid droplets) containing a previously described positive hole transport layer forming material is discharged onto pixel electrodes 111 by the aforementioned film deposition unit 30 using a liquid discharge method.

The procedure for forming the positive hole transport layer by a liquid discharge method consists of filling a composite ink containing the material of positive hole transport layer 110a into inkjet head 20 for discharging a liquid, positioning the discharge nozzles of inkjet head 20 to be in opposition to a pixel electrode 111 located in an opening of bank sections 112, and discharging ink droplets, for which the amount of liquid per droplet is controlled, from the nozzles while relatively moving head 20 and substrate 2 (discharge step), Subsequently, the ink droplets are subjected to drying treatment after being discharged, and a positive hole transport layer is formed by evaporating the polar solvent (liquid material) contained in the composite ink.

A composition in which, for example, a mixture of a polythophene derivative such as polyethylene dioxythiophene (PEDOT) and polystyrene sulfonic acid (PSS) and so forth is dissolved in a polar solvent can be used for the composition used here. Examples of polar solvents include isopropyl alcohol (IPA), normal butanol, γ-butyrolactone, N-methylpyrrolidone (NMP), 1,3-dimethyl-2-imidazole (DMI and its derivatives, as well as carbitol acetate, butyl carbitol acetate and other glycol ethers.

A specific example of a composition is 12.52 wt % PEDOT:PSS mixture (PEDOT/PSS=1:20), 1.44 wt % PSS, 10 wt % IPA, 27.48 wt % NMP and 50 wt % DMI. Furthermore, the viscosity of the composition is preferably about 2–20 cPs, and particularly preferably about 4–15 cPs.

Figure 7:
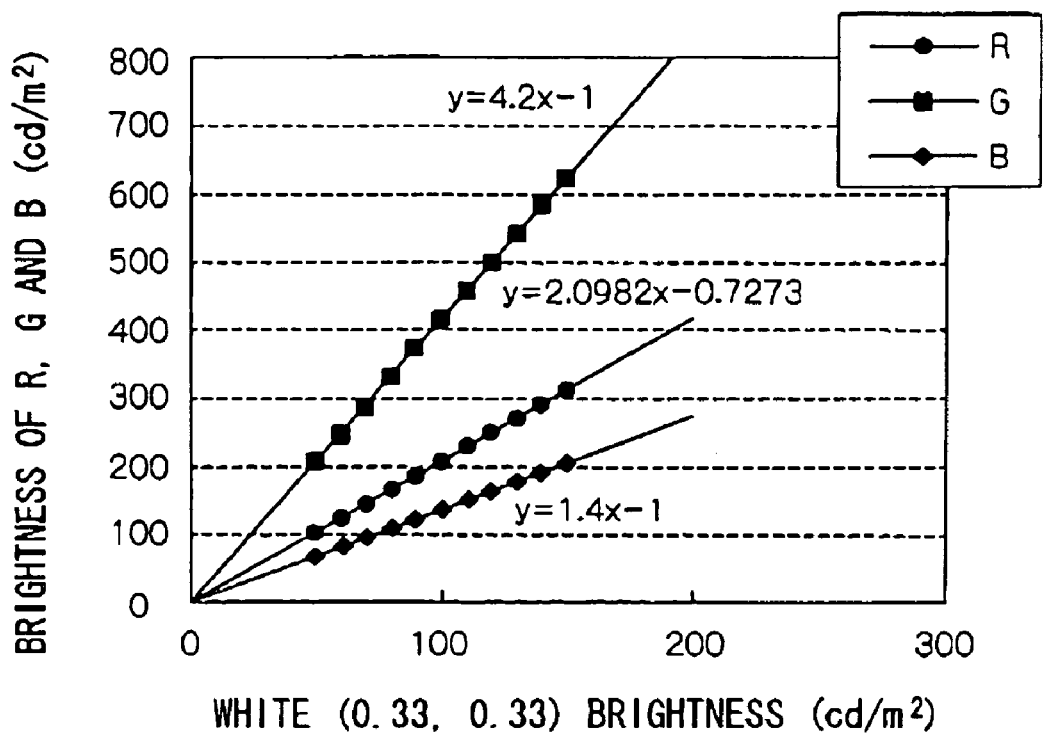
FIG. 7 is a graph showing the relationship between white chromaticity and respective required brightness of R, G and B.

Here, in the present embodiment, in order to adjust deterioration of emission characteristics over time for a plurality of colors (plurality of types) of pixel regions for which the changes in emission characteristics differ over time, the thickness of positive hole transport layer 110a is changed corresponding to the degree of changes over time of each color. FIG. 7 shows a graph of the required brightness of E, B and B in the case of plotting white chromaticity based on CIE chromaticity coordinates (0.33, 0.33). As shown in this graph, in order to obtain a required brightness of 150 cd/m$^2$ with white brightness, for example, brightness of 314 cd/m$^2$ for red, 629 cd/m$^2$ for green and 209 cd/m$^2$ for blue are respectively required. In addition, in the case of being only able to obtain white brightness of 100 cd/m$^2$ due to deterioration over time, brightness of 209 cd/m$^2$ for red, 419 cd/m$^2$ for green and 139 cd/m$^2$ for blue are respectively required. In other words, although it is possible to accommodate deterioration of white brightness over time by increasing the voltage applied to the organic EL apparatus, in order to maintain white balance, it is necessary that the deterioration over time of each of the colors of R, G and B be compatible.

Figure 8:
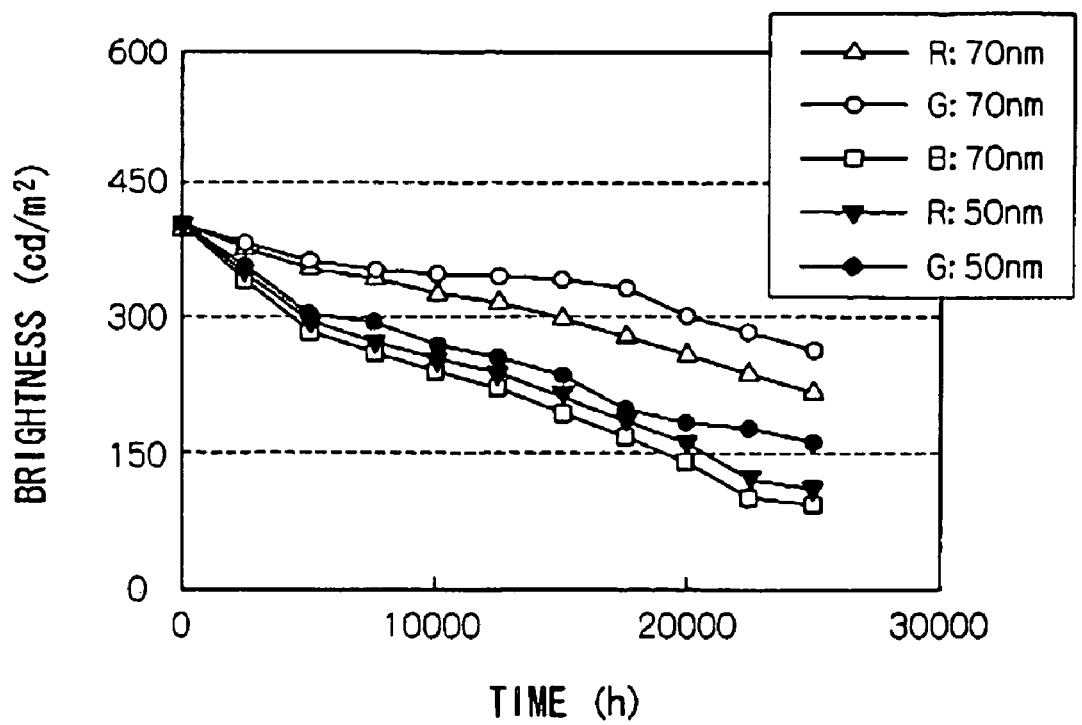
FIG. 8 is a graph showing the relationship between positive hole transport layer thickness and deterioration over time.

FIG. 8 shows a graph of the relationship between the thickness of positive hole transport layers 110a1 to 110a3 corresponding to each color and deterioration over time. As shown in this graph, in the case of forming positive hole transport layers 110a1 to 110a3 at the same thickness (here, 70 nm), the degree of deterioration of blue color is larger as compared with the other colors. Namely, in the case of causing organic EL layers 110b1 to 110b3 to emit light using positive hole transport layers 110a1 to 110a3 having the same thickness, since the blue color deteriorates first, the color balance in a full-color panel shifts towards red and green color due to the deterioration of blue color over time. In response to this, in order to adjust the deterioration of red and green color (predetermined types of light-emitting units) over time while maintaining the film thickness of blue color positive hole transport layer 110a3 at 70 nm, although the deterioration of red and green color accelerates resulting in a decrease in service life if the film thicknesses of red color positive hole transport layer 110a1 and green color positive hole transport layer 110a2 are made to be 50 nm, since the deterioration of R, G and B over time is the same, color balance during full-color display can be maintained constant. Furthermore, although the service lives of red and green color decrease, since these shortened service lives are made to match the service life of the blue color, there is no effect on the service life of organic EL apparatus 1.

Thus, as a result of control system 25 controlling the driving of piezoelectric devices 92 in the positive hole transport layer formation step, the droplet weight or number of droplets of the liquid droplets (liquid) discharged according to color are controlled so that the film thickness of blue color positive hole transport layer 110a3 is ultimately 70 nm, and the film thicknesses of red color positive hole transport layer 110a1 and green color positive hole transport layer 110a2 are ultimately 50 nm (deterioration adjustment step). By then subsequently carrying out drying treatment and heat treatment, positive hole transport layers 110a1 to 110a3 are formed on a pixel electrode 111.

Furthermore, all following steps, including this positive hole transport layer formation step, are preferably carried out in an atmosphere free of water and oxygen. For example, the steps are preferably carried out in an inert gas atmosphere such as a nitrogen atmosphere or argon atmosphere.

(Organic EL Layer Formation Step)

Figure 6B:
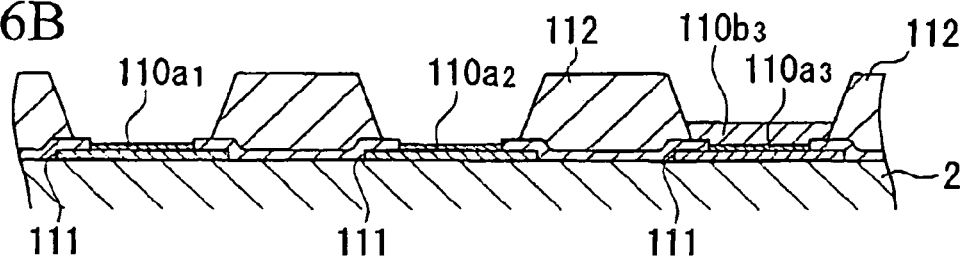
Figure 6C:
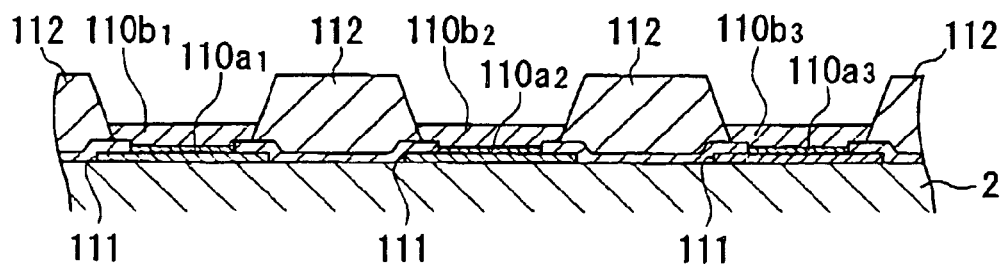

Next, as shown in FIG. 6B, a blue color organic EL layer 110b3, for example, is formed on blue color pixel electrode 111 on which is laminated positive hole transport layer 110a. Namely, a composite ink containing an organic EL layer material is discharged onto positive hole transport layer 110a by, for example, a liquid droplet discharge method in the same manner as positive hole transport layer 110a, and this is followed by drying treatment and heat treatment to form a blue color organic EL layer 110b3 in an opening formed in bank sections 112.

In the organic EL layer formation step, in order to prevent re-dissolution of positive hole transport layer 110a, a non-polar solvent in which positive hole transport layer 110a is insoluble is used for the solvent of the composite ink used during formation of the organic EL layer. In this case, a surface modification step is preferably carried out prior to formation of the organic EL layer to enhance the wettability of the surface of positive hole transport layer 110a with respect to the non-polar solvent. A surface modification step is carried out by, for example, coating the same solvent or similar type of solvent as the aforementioned non-polar solvent onto positive hole transport layer 110a by spin coating or dipping and so forth followed by drying. Furthermore, examples of surface modification solvents used here that are the same as the non-polar solvent of the composite ink include cyclohexylbenzene, dihydrobenzofaran, trimethylbenzene and tetramethylbenzene, while examples of solvents that are of a similar type as the non-polar solvent of the composite ink include toluene and xylene.

In addition, the procedure for forming an organic EL layer by a liquid droplet discharge method consists of filling inkjet head 20 with a composite ink containing a material of, for example, a blue color organic EL layer, positioning the discharge nozzles of inkjet head 20 to be in opposition to a blue color positive hole transport layer 110a located in an opening of bank sections 112, and discharging ink droplets, for which the amount of liquid per droplet is controlled, from the nozzles while relatively moving head 20 and substrate 2. The discharged ink droplets then spread over positive hole transport layer 110a and fill the openings of bank sections 112. Continuing, by then subjecting the ink droplets to drying treatment after they have been discharged, the non-polar solvent contained in the composite ink is evaporated resulting in the formation of blue color organic EL layer 110b3. Subsequently, red color organic EL layer 110b1 and green color organic EL layer 110b2 are formed using a composite ink containing a material for a red color EL organic layer and a composite ink containing a material for a green color organic EL layer in the same manner as blue color organic EL layer 110b3 (see FIG. 6A).

Furthermore, examples of light-emitting materials for composing organic, EL layers 110b include low molecular weight organic EL materials and high molecular weight organic EL materials soluble in fluorene-based polymer derivatives, (poly)paraphenylene vinylene derivatives, polyphenylene derivatives, polyfluorene derivatives, polyvinylcarbazole, polythiophene derivatives, perylene-based pigments, coumarin-based pigments, rhodamine-based pigments and other benzene derivatives. Examples of light-emitting materials that can be used include rubrene, perylene, 9,10-diphenylanthracene, tetraphenylbutadiene, Nile red, coumarin 6 and quinacridone. On the other hand, non-polar solvents are preferably those in which positive hole transport layer 110a is insoluble, and examples of non-polar solvents that can be used include cyclohexylbenzene, dihydrobenzofuran, trimethylbenzene and tetramethylbenzene.

Here, in addition to the aforementioned piezo method, examples of liquid droplet discharge methods include electrostatic control, pressurized vibration, thermoelectric conversion and electrostatic attraction. In the electrostatic control method, an electric charge is imparted to a material with a charged electrode and the material is discharged from nozzles by controlling the direction of dispersal with a deflecting electrode. In addition, in the pressurized vibration method, an ultra-high pressure is applied to a material and the material is discharged from the tips of nozzles such that material is discharged from the nozzles in a straight line when a control voltage is not applied, but is dispersed and not discharged from the nozzles due to the occurrence of electrostatic repulsion between materials when a control voltage is applied. In addition, in the thermoelectric conversion method, the material is rapidly vaporized by a heater provided in a chamber in which the material is stored to form bubbles, and the material within the chamber is then discharged according to the pressure of the bubbles. In the electrostatic attraction method, an extremely low voltage is applied inside a chamber in which a material is stored to form a meniscus of the material on the nozzles, and then the material is extracted after applying electrostatic attraction in this state. In addition, other technologies that can be applied include a method that utilizes the change in viscosity of a fluid caused by a magnetic field, and a method that disperses a material with sparks generated from an electrical discharge.

Among the aforementioned liquid droplet discharge technologies, the piezo method offers the advantage of having little effect on the material composition since it does not involve the application of heat to the material.

(Cathode Formation Step)

Figure 6D:
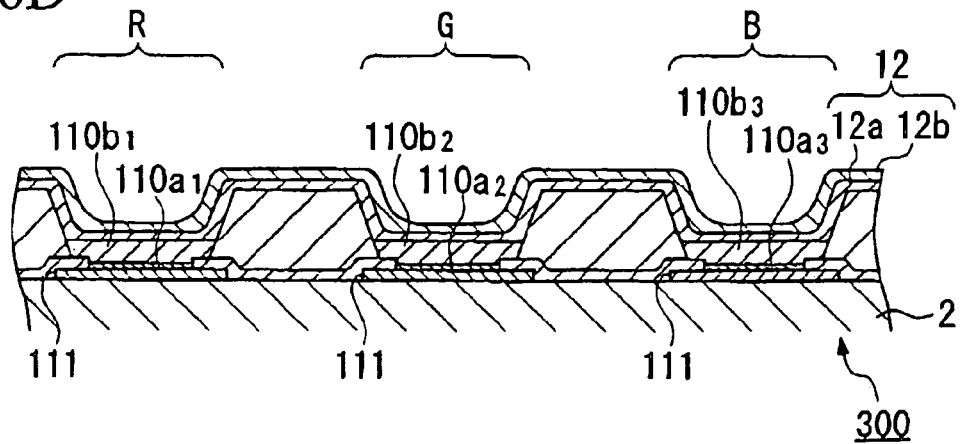

Next, as shown in FIG. 6D, a counter electrode (cathode) 12 is formed as a pair with pixel electrode (anode) 111. Namely, cathode 12 is formed by sequentially laminating calcium layer 12a and aluminum layer 12b over the entire area on substrate 2 that contains organic EL layer 110b. As a result, cathode 12 is laminated over the entire area of organic EL layer 110b containing the area in which red color organic EL layer 110b1, green color organic EL layer 110b2 and blue color organic EL layer 110b3 are formed, and organic EL devices respectively corresponding to each of the colors of red (R), green (G) and blue (B) are formed.

Cathode 12 is preferably formed using, for example, vapor deposition, sputtering or CVD, while vapor deposition is particularly preferable since it is capable of preventing damage to organic EL layer 110b caused by heat.

In addition, a protective layer of $SiO_2$ or SiN and so forth may also be provided on cathode 12 to prevent oxidation.

(Sealing Step)

Finally, substrate 2 on which organic EL devices (light-emitting devices) are formed is sealed with sealing substrate 3b (see FIG. 3) by means of sealing resin. For example, a sealing resin composed of thermosetting resin or UV-cured resin is coated onto the peripheral edges of substrate 2 followed by arranging sealing substrate 3 on the sealing resin. The sealing step is preferably carried out in an inert gas atmosphere such as nitrogen, argon or helium gas. If this step is carried out in air, water, oxygen and so forth penetrate to cathode 12 through defects in the case pin holes or other defects are present in cathode 12 resulting in the risk of cathode 12 being oxidized and thereby making this undesirable.

Subsequently, together with connecting cathode 12 to the wiring of substrate 2, the wiring of circuit device section 14 (see FIG. 3) is connected to a drive IC (drive circuit) provided either on or outside substrate 2 to complete the organic EL apparatus 1 of the present embodiment.

As has been described above, in the present embodiment, since deterioration of emission characteristics over time of red and green light are adjusted so as to match blue light having the largest degree of deterioration over time by changing the film thickness of the positive hole transport layers, even if changes occur over time, the deterioration over time of each color is the same, thereby making it possible to maintain a satisfactory emission state without a shift in color balance. Thus, it is no longer necessary for a consumer to readjust the white balance after purchase or provide a complex drive circuit. In addition, in the present embodiment, since the aforementioned deterioration of emission characteristics over time can be adjusted by a simple constitution and process consisting of controlling the weight or number of liquid droplets when a liquid containing a positive hole transport layer material is discharged in the form of liquid droplets, together with the system configuration being able to be simplified, production efficiency can be improved.

Furthermore, the electro-optical apparatus of the present invention is equipped with a display system in the form of the aforementioned organic EL apparatus (emitter), specific examples of which include, in addition to the aforementioned organic EL apparatus, an inorganic electroluminescence display, plasma display (PDP) and field emission display (FED).

EXAMPLE (1) Positive hole transport layer materials were printed at 10 ng×10 shots onto pixels surrounded by bank sections for R (red), G (green) and B (blue) pixels, respectively. As a result, the film thickness of the R, G and B pixels was 60 nm each.

(2) A light-emitting layer (organic EL layer) was deposited on the R, G and B pixels, respectively, at 80 nm while in this state followed by the deposition of a cathode thereon by vacuum vapor deposition to obtain a light emitting device.

(3) As a result of measuring the service life of this device, the service half-lives of R, G and B were 1800 h for R, 3000 h for G and 1000 h for B. However, the time during which white color was obtained was 700 h due to a shift in color balance during white display.

(4) Next, liquid droplets of a positive hole transport layer forming material were discharged onto the pixels surrounded by bank sections at 10 ng×8 shots for the R pixel, 10 ng×6 shots for the G pixel, and 10 ng×10 shots for the B pixel. As a result, the film thicknesses of the R, G and B pixels were 50 nm for the R pixel, 45 nm for the G pixels and 60 nm for the blue pixel.

(5) Light-emitting layers were deposited at 80 nm for R, G and B, respectively, while in this state followed by the deposition of a cathode thereon by vacuum vapor deposition to obtain a light-emitting device.

(6) As a result of measuring the service life of this device, the service half-lives of R, G and B were 1200 h for R, 1300 h for G and 1000 h for B. However, the time during which white color was obtained was 940 h.

(7) Namely, the service life of the panel was demonstrated to be prolonged even though the service life of each of the colors of red and green decreased.

SECOND EMBODIMENT

Figure 9:
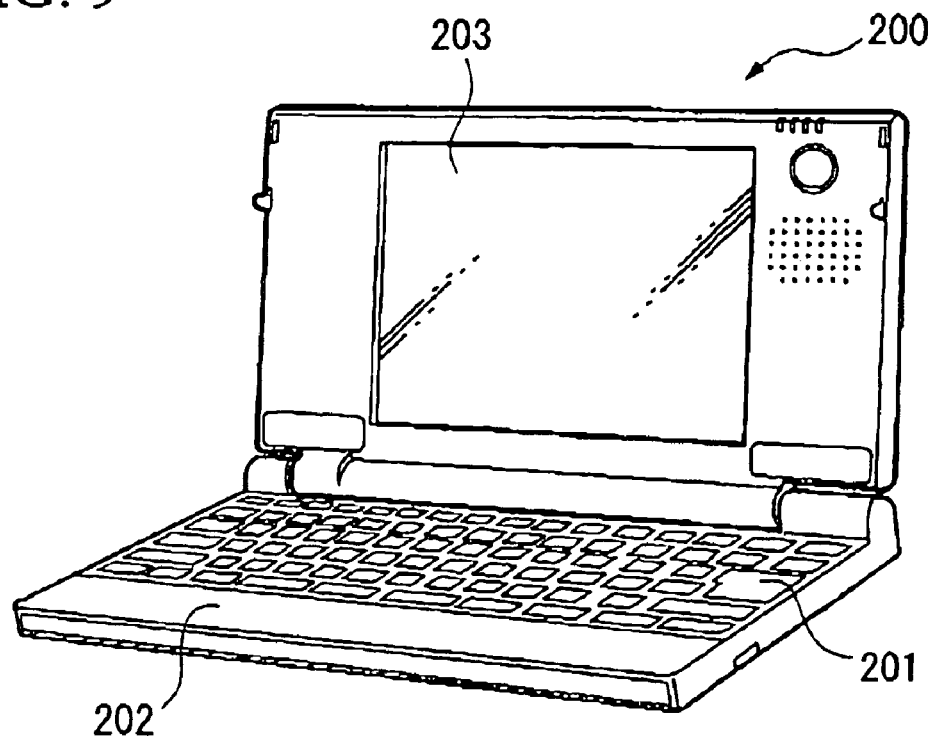
FIG. 9 is a perspective view showing a mobile personal computer as an example of electronic apparatus equipped with an organic EL apparatus.

FIG. 9 is a perspective view showing a mobile personal computer as an example of electronic apparatus equipped with an organic EL apparatus (emitter) of the present invention.

Mobile personal computer 200 is provided with a main unit 202 equipped with a keyboard 201, and a display unit 203 composed of an organic EL apparatus (emitter) according to the aforementioned first embodiment.

THRID EMBODIMENT

Figure 10:
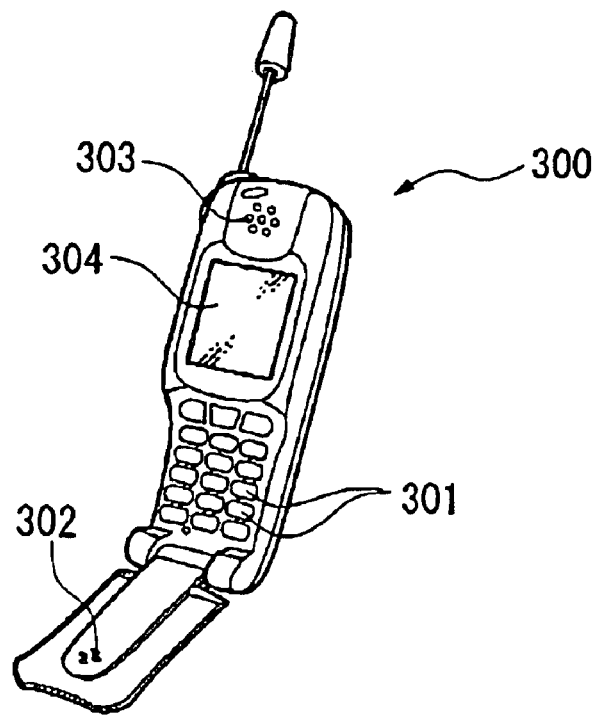
FIG. 10 is a perspective view showing a mobile telephone as an example of electronic apparatus equipped with an organic EL apparatus.

FIG. 10 is a perspective view showing a cell phone as an example of electronic apparatus equipped with an organic EL apparatus (emitter) of the present invention.

Mobile telephone 300 is provided with a plurality of operating buttons 301, an earpiece 302, a mouthpiece 303 and an organic EL apparatus (emitter) 304 according to the aforementioned first embodiment.

FOURTH EMBODIMENT

Figure 11:
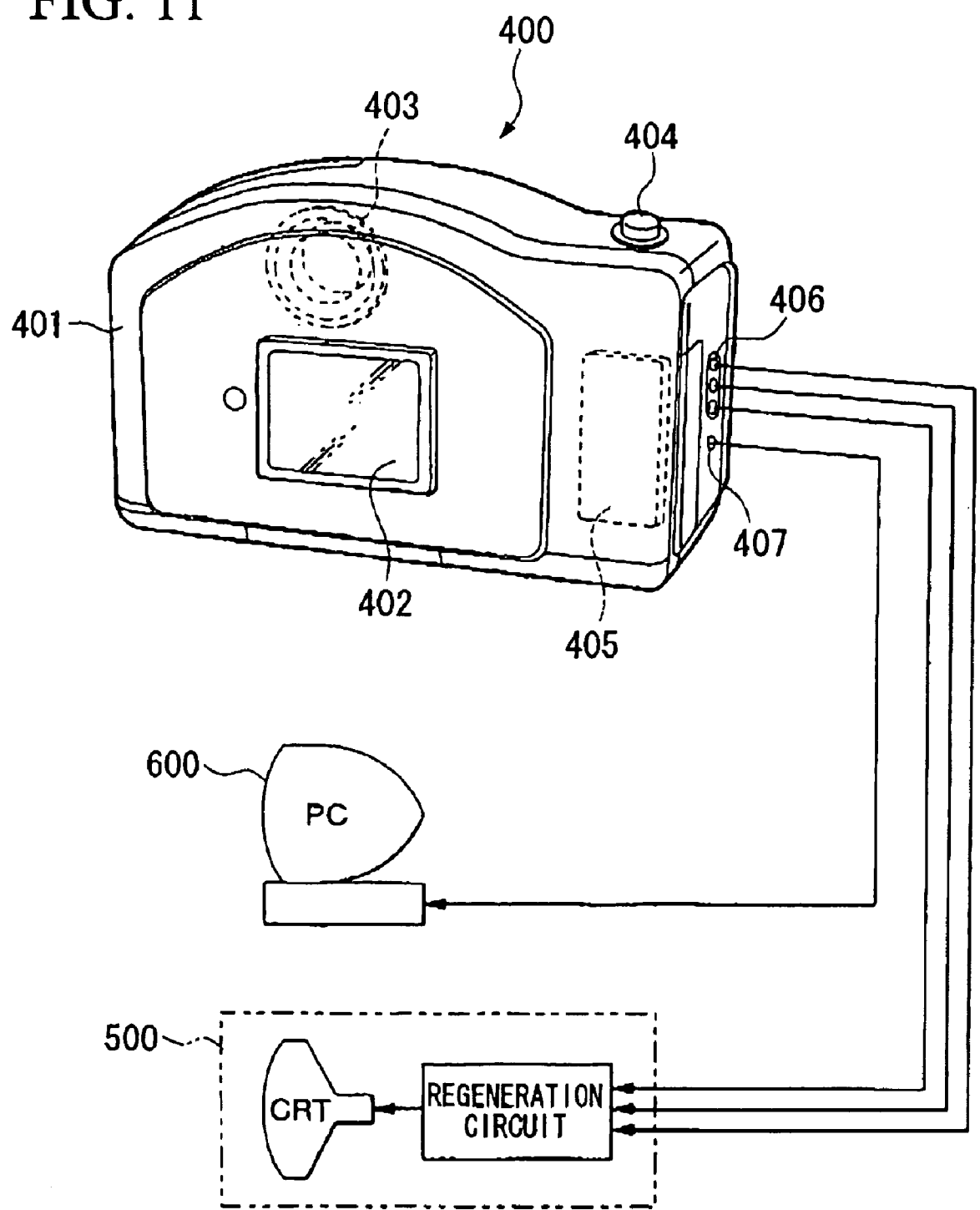
FIG. 11 is a perspective view showing a digital still camera as an example of electronic apparatus equipped with an organic EL apparatus.

FIG. 11 is a perspective view showing a digital still camera as an example of electronic apparatus equipped with an organic EL apparatus (emitter) according to the present invention. Furthermore, connections with external equipment have been simplified.

Digital camera 400 is provided with a case 401, a display panel 402 provided on the back and composed of an organic EL apparatus (emitter) according to the aforementioned first embodiment, a light receiving unit 403 provided on the viewing side of case 401 (back side in the drawing) containing components such as an optical lens and CCD (charge coupled device), a shutter button 404, and a circuit board 405 that transfers and stores image signals of the CCD when shutter button 404 is pressed. This display panel 402 performs display based on image signals generated following photoelectric conversion from a CCD or other image-capturing device.

In addition, video signal output terminals 406 and an input/output terminal 407 are provided on the side of case 401 in this digital still camera 400. As shown in the drawing, a television monitor 500 is connected to the former video signal output terminals 406, and a personal computer 600 is connected to the latter data communication input/output terminal 407 as necessary to form a constitution in which image signals stored in the memory of circuit board 405 are output to television monitor 500 or personal computer 600 according to predetermined operations.

Furthermore, the electronic apparatus equipped with an organic EL apparatus (emitter) of the present invention is not limited to those described above, but rather examples of other electronic apparatus include televisions, portable televisions, direct-view video tape recorders equipped with a viewfinder monitor, PDA, portable gaming machines, car-mounted audio equipment, automobile instrumentation, CRT, car navigation systems, pagers, electronic notebooks, calculators, wristwatches, word processors, workstations, video telephones, POS terminals and equipment equipped with a touch panel.

Although the above has provided an explanation of preferable embodiments of the present invention with reference to the drawings, it goes without saying that the present invention is not limited to these embodiments. The aforementioned embodiments are intended to indicate examples of the shapes and combinations, etc. of each composite member shown, and hence the present invention may be altered in various ways based on design requirements and so forth within a range that does not deviate from the gist of the present invention.

For example, impurity ions (for example, anions such as $F^-$, $H_2PO_4^-$, $Cl^-$, $NO^{2-}$; $Br^-$, $NO_3^-$ or $SO^{4-}$, or cations such as $Li^+$, $Na^+$, $NH^+$, $K^+$, $Ca^{2+}$, $Mg^{2+}$, $Rb^{2+}$, $Cs^+$ or $Ba^{2+}$ may be mixed into one of either the light-emitting material that composes organic EL layer 110 or the positive hole transport layer forming material that composes positive hole transport layer 110a to accelerate the degree of deterioration over time for a light-emitting unit for which deterioration over time is to be adjusted (accelerated). In this case as well, the degree of deterioration over time of each color can be made to be uniform.

In addition, a constitution can also be employed in which the thickness of cathode 12 is changed (patterned) corresponding to the light-emitting unit. For example, although cathode 12 is formed from calcium layer 12a and aluminum layer 12b, a constitution may be employed in which the calcium layer having a large resistance is formed to be thicker for a light-emitting unit for which deterioration over time is to be adjusted (accelerated). In this case, since a higher voltage is required as a result of increasing the resistance, the degree of deterioration over time can be increased due to decrease in efficiency. In this case, cathode 12 (calcium layer 12a) serves as an electron donor that functions as a deterioration adjustment unit. Furthermore, in addition to the cathode, the film thickness of the electron injection layer can also be changed corresponding to the light-emitting unit in the case of providing an electron injection layer as another means of adjusting deterioration of emission characteristics over time with an electron donor.

Moreover, a constitution can also be employed in which only the bank sections corresponding to the light-emitting unit for which deterioration over time is to be adjusted (accelerated) can be made to extend from the sealing resin. In this constitution, since the cathode is oxidized due to the penetration of water, oxygen and so forth from the extended bank sections, deterioration over time of that light-emitting unit can be accelerated.

What is claimed is:

1. An emitter having a plurality of types of light-emitting units with different changes in emission characteristics over time, comprising a deterioration adjustment device which adjusts the deterioration of the emission characteristics over time in a predetermined type of light-emitting unit,
wherein the light-emitting units respectively have a light-emitting layer and a hole donor which supplies positive holes to the light-emitting layer, and
the deterioration adjustment device is the hole donor in which the thickness is adjusted based on the deterioration in emission characteristics over time in the predetermined type of light-emitting unit.

2. An emitter having a plurality of types of light-emitting units with different changes in emission characteristics over time, comprising a deterioration adjustment device which adjusts the deterioration of the emission characteristics over time in a predetermined type of light-emitting unit,
wherein the light-emitting units respectively have a light-emitting layer and an electron donor which supplies electrons to the light-emitting layer, and
the deterioration adjustment device is the electron donor in which the thickness is adjusted based on the deterioration of emission characteristics over time in the predetermined type of light-emitting unit.

3. An emitter having a plurality of types of light-emitting units with different changes in emission characteristics over time, comprising a deterioration adjustment device which adjusts the deterioration of the emission characteristics over time in a predetermined type of light-emitting unit,
wherein the light-emitting units respectively have a light-emitting layer and a hole donor which supplies positive holes to the light-emitting layer, and
the deterioration adjustment device is at least one of either the light-emitting layer and the hole donor into which impurities are mixed based on the deterioration of emission characteristics over time in the predetermined type of light-emitting unit.

4. An emitter according to claim 1,
wherein the deterioration adjustment device adjusts the deterioration of emission characteristics over time in the predetermined type of light-emitting unit according to the light-emitting unit among the plurality of types of light-emitting units that has the largest degree of deterioration of emission characteristics over time.

5. An electro-optical apparatus comprising the emitter according to claim 1 as display apparatus.

6. An electronic apparatus comprising the emitter according to claim 1 as display apparatus.

7. An emitter according to claim 1 comprising a plurality of colors of light-emitting units wherein said deterioration adjustment device adjusts the deterioration of emission characteristics of light-emitting units over time in accordance with one color light-emitting unit with a largest degree of deterioration of emission characteristics over time.

8. An emitter according to claim 1 comprising red, green and blue light-emitting units, wherein said deterioration adjustment device adjusts the deterioration of emission characteristics of the red and green light-emitting units over time in accordance with the blue light-emitting unit with a largest degree of deterioration of emission characteristics over time.

9. An emitter according to claim 2,
wherein the deterioration adjustment device adjusts the deterioration of emission characteristics over time in the predetermined type of light-emitting unit according to the light-emitting unit among the plurality of types of light-emitting units that has the largest degree of deterioration of emission characteristics over time.

10. An electro-optical apparatus comprising the emitter according to claim 2 as display apparatus.

11. An electronic apparatus comprising the emitter according to claim 2 as display apparatus.

12. An emitter according to claim 2 comprising a plurality of colors of light-emitting units wherein said deterioration adjustment device adjusts the deterioration of emission characteristics of light-emitting units over time in accordance with one color light-emitting unit with largest degree of deterioration of emission characteristics over time.

13. An emitter according to claim 2 comprising red, green and blue light-emitting units, wherein said deterioration adjustment device adjusts the deterioration of emission characteristics of red and green light-emitting units over time in accordance with the blue light-emitting unit with largest degree of deterioration of emission characteristics over time.

14. An emitter according to claim 3,
wherein the deterioration adjustment device adjusts the deterioration of emission characteristics over time in the predetermined type of light-emitting unit according to the light-emitting unit among the plurality of types of light-emitting units that has the largest degree of deterioration of emission characteristics over time.

15. An electro-optical apparatus comprising the emitter according to claim 4 as display apparatus.

16. An electronic apparatus comprising the emitter according to claim 3 as display apparatus.

17. An emitter according to claim 3 comprising a plurality of colors of light-emitting units wherein said deterioration adjustment device adjusts the deterioration of emission characteristics of light-emitting units over time in accordance with one color light-emitting unit with largest degree of deterioration of emission characteristics over time.

18. An emitter according to claim 3 comprising red, green and blue light-emitting units, wherein said deterioration adjustment device adjusts the deterioration of emission characteristics of red and green light-emitting units over time in accordance with the blue light-emitting unit with largest degree of deterioration of emission characteristics over time.

* * * * *

UNITED STATES PATENT AND TRADEMARK OFFICE
CERTIFICATE OF CORRECTION

| | | |
|---|---|---|
| PATENT NO. | : 7,071,486 B2 | Page 1 of 1 |
| APPLICATION NO. | : 10/760178 | |
| DATED | : July 4, 2006 | |
| INVENTOR(S) | : Hirofumi Sakai | |

It is certified that error appears in the above-identified patent and that said Letters Patent is hereby corrected as shown below:

Title Page, item [56]; References cited, Other Publications: Add
-- Communication from Taiwanese Patent Office regarding counterpart application (and English translation thereof) --.

Col. 1, line 31: "Light" should be -- (light --.

Col. 4, line 67: "font" should be -- front --.

Col. 5, line 8: "40," should be -- 40. --.

Col. 5, line 25: "0" should be -- $\theta$ --.

Col. 5, line 35: "7" should be -- $\gamma$ --.

Col. 5, line 37: "a" should be -- $\alpha$ --.

Col. 6, line 32: delete "et".

Signed and Sealed this

Fifth Day of January, 2010

David J. Kappos
*Director of the United States Patent and Trademark Office*

UNITED STATES PATENT AND TRADEMARK OFFICE
CERTIFICATE OF CORRECTION

PATENT NO. : 7,071,486 B2
APPLICATION NO. : 10/760178
DATED : July 4, 2006
INVENTOR(S) : Hirofumi Sakai It is certified that error appears in the above-identified patent and that said Letters Patent is hereby corrected as shown below:

Title Page, item [56]; References cited, Other Publications: Add
-- Communication from Taiwanese Patent Office regarding counterpart application (and English translation thereof) --.

Col. 1, line 31: "Light" should be -- (light --.

Col. 4, line 67: "font" should be -- front --.

Col. 5, line 8: "40," should be -- 40. --.

Col. 5, line 25: "0" should be -- θ --.

Col. 5, line 35: "7" should be -- γ --.

Col. 5, line 37: "a" should be -- α --.

Col. 6, line 32: delete "et".

Col. 9, line 3: "polyirmide" should be -- polyimide --.

Col. 9, line 52: "Tr" should be -- Tm --.

Col. 9, line 62: "layer 10" should be -- layer 110 --.

Col. 10, line 66: "step)," should be -- step). --.

Col. 11, line 11: "(DMI" should be -- (DMI) --.

Col. 11, line 25: "E, B" should be -- R, G --.

This certificate supersedes the Certificate of Correction issued January 5, 2010.

Signed and Sealed this

Twenty-fourth Day of August, 2010

David J. Kappos
*Director of the United States Patent and Trademark Office*

CERTIFICATE OF CORRECTION (continued)
U.S. Pat. No. 7,071,486 B2

Col. 12, lines 44-45: "dihydrobenzofaran" should be -- dihyrobenzofuran --.

Col. 16, line 28: "NH$^+$" should be -- NH$_4^+$ --.

Col. 16, line 28: "Ba$^{2+}$" should be -- "Ba$^{2+}$) --.

Col. 18, line 37 (claim 15): "claim 4" should be -- claim 3 --.